(12) United States Patent
Schemmann et al.

(10) Patent No.: US 6,690,235 B2
(45) Date of Patent: Feb. 10, 2004

(54) DISTORTION GENERATION IN BALANCED AND UNBALANCED SIGNALS

(75) Inventors: Marcel F. C. Schemmann, Echt (DE); Zhijian Sun, Jamesville, NY (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 50 days.

(21) Appl. No.: 09/896,198

(22) Filed: Jun. 29, 2001

(65) Prior Publication Data

US 2003/0001671 A1 Jan. 2, 2003

(51) Int. Cl.$^7$ ................................................. H03F 1/26
(52) U.S. Cl. ........................................ 330/149; 330/301
(58) Field of Search .......................... 330/2, 149, 301, 330/116, 117

(56) References Cited

U.S. PATENT DOCUMENTS 5,252,930 A * 10/1993 Blauvelt ...................... 330/149
6,054,896 A * 4/2000 Wright et al. ............... 330/149

* cited by examiner

Primary Examiner—Khanh Van Nguyen
(74) Attorney, Agent, or Firm—Michael E. Belk

(57) ABSTRACT

A method and structure for generation of signal distortion. In a first embodiment, a first signal distortion generator (SDG) receives a pair of balanced input currents $+X$ and $-X$, each having a same angular frequency $\omega$. The first SDG generates a pair of output currents $+X+\Delta X_1$ and $-X+\Delta X_2$, wherein $\Delta X_1 - \Delta X_2 = G_2 X^2 + G_3 X^3$. $G_2$ and $G_3$ are each independent of $X$, and at least one of $G_2$ and $G_3$ is nonzero. In a second embodiment, a second SDG receives an unbalanced input current P having an angular frequency $\omega$. The second SDG generates an output current $U_{OUT}$ of a form $P+(\alpha P+\beta P^2+\gamma P^3)/2$. $\alpha$, $\beta$, and $\gamma$ are each nonzero and each independent of P. The second SDG includes a distortion generating circuit path that has an input impedance ratio of at least 5 and an output impedance ratio of at least 5.

60 Claims, 3 Drawing Sheets

DISTORTION GENERATION IN BALANCED AND UNBALANCED SIGNALS

BACKGROUND OF THE INVENTION

1. Technical Field

The present invention relates to generation of distortion in an electrical signal line system.

2. Related Art

A nonlinear power amplifier that amplifies an input electrical signal adds undesired distortion components to the signal, and the output signal from the power amplifier includes such distortion components.

There is a need for a method and structure that enables the output signal from the power amplifier to be free of signal distortion or to have a reduced level of signal distortion.

SUMMARY OF THE INVENTION

The present invention provides an electrical structure, comprising a signal distortion generator that is configured to receive a pair of balanced input currents $+X$ and $-X$ each having a same angular frequency $\omega$, and to generate a pair of output currents $+X+\Delta X_1$ and $-X+\Delta X_2$, wherein $\Delta X_1 - \Delta X_2 = G_2 X^2 + G_3 X^3$, wherein $G_2$ and $G_3$ are each independent of $X$, and wherein at least one of $G_2$ and $G_3$ is nonzero.

The present invention provides a method for forming an electrical structure, comprising providing a signal distortion generator that is configured to receive a pair of balanced input currents $+X$ and $-X$ each having a same angular frequency $\omega$, and to generate a pair of output currents $+X+\Delta X_1$ and $-X+\Delta X_2$, wherein $\Delta X_1 - \Delta X_2 = G_2 X^2 + G_3 X^3$, wherein $G_2$ and $G_3$ are each independent of $X$, and wherein at least one of $G_2$ and $G_3$ is nonzero.

The present invention provides a method for generating signal distortion, comprising:

providing a signal distortion generator (SDG) that is configured to receive a pair of balanced input currents $+X$ and $-X$ each having a same angular frequency $\omega$, and to generate a pair of output currents $+X+\Delta X_1$ and $-X+\Delta X_2$, wherein $\Delta X_1 - \Delta X_2 = G_2 X^2 + G_3 X^3$, wherein $G_2$ and $G_3$ are each independent of $X$, and wherein at least one of $G_2$ and $G_3$ is nonzero;

providing the pair of balanced input currents;

receiving by the SDG the pair of balanced input currents; and generating by the SDG the pair of output currents.

The present invention provides an electrical structure, comprising a Type 3 signal distortion generator (SDG) that is configured to receive an unbalanced input current P having an angular frequency $\omega$, and to generate an output current $U_{OUT}$ of a form $P + (\alpha P + \beta P^2 + \gamma P^3)/2$, wherein $\alpha$, $\beta$, and $\gamma$ are each nonzero and each independent of P, and wherein the SDG includes a distortion path (DP) that has an input impedance ratio of at least 5 and an output impedance ratio of at least 5.

The present invention provides a method for forming an electrical structure, comprising providing a Type 3 signal distortion generator (SDG) that is configured to receive an unbalanced input current P having an angular frequency $\omega$, and to generate an output current $U_{OUT}$ of a form $p + (\alpha P + \beta P^2 + \gamma P^3)/2$, wherein $\alpha$, $\beta$, and $\gamma$ are each nonzero and each independent of P, and wherein the SDG includes a distortion path (DP) that has an input impedance ratio of at least 5 and an output impedance ratio of at least 5.

The present invention provides a method for generating signal distortion, comprising:

providing a Type 3 signal distortion generator (SDG) that is configured to receive an unbalanced input current P having an angular frequency $\omega$, and to generate an output current $U_{OUT}$ of a form $P + (\alpha P + \beta P^2 + \gamma P^3)/2$, wherein $\alpha$, $\beta$, and $\gamma$ are each nonzero and each independent of P, and wherein the SDG includes a distortion path (DP) that has an input impedance ratio of at least 5 and an output impedance ratio of at least 5;

providing the unbalanced input current P;

receiving by the SDG the unbalanced input current P; and generating by the SDG the output current $U_{OUT}$.

The present invention provides a method and structure that enables the output signal from the power amplifier to be free of signal distortion or to have a reduced level of signal distortion.

DETAILED DESCRIPTION OF THE INVENTION

Figure 1:
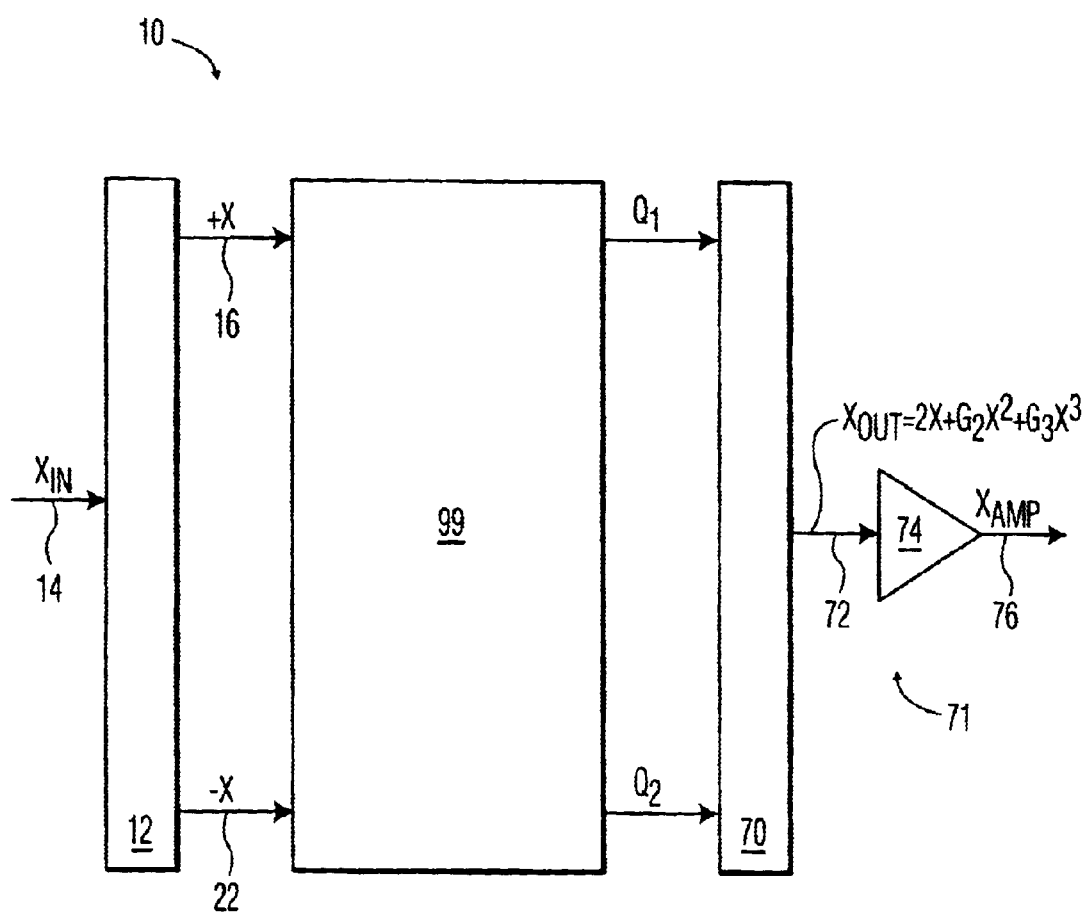
FIG. 1 depicts an electrical structure that includes a signal distortion generator for balanced signals, in accordance with embodiments of the present invention.

FIG. 1 illustrates an electrical structure 10 that includes a signal distortion generator (SDG) 99, in accordance with embodiments of the present invention. An unbalanced electrical signal $X_{IN}$ on transmission line 14 is processed by a balun 12. A "signal" or "electrical signal", as used herein, comprises an electrical current, and any variable used herein to represent a signal or electrical signal (e.g., $X_{IN}$) denotes an electrical current. The unbalanced electrical signal $X_{IN}$ is a periodic electrical signal having an angular frequency $\omega$ (e.g., $X_{IN}$ may be proportional to $\cos \omega t$ where t denotes time). An example of the unbalanced electrical signal $X_{IN}$ is a cable television (CATV) signal.

A balun 12 converts the unbalanced electrical signal $X_{IN}$ into balanced signals $+X$ and $-X$, each having the angular frequency $\omega$, on transmission line segments 16 and 22, respectively. Although the balun 12 may have power losses, such power losses are negligible for the purpose of the present invention. Accordingly, $+X$ and $-X$ may be approximated as $+X = X_{IN}/2$, and $-X = -X_{IN}/2$. Definitionally, the balanced signals $+X$ and $-X$ respectively represent electrical currents that are equal in magnitude and opposite in polarity. Thus, the signal $-X$ is equal to $+X$ phased shifted by $\pi$ radians. In contrast, the unbalanced signal $X_{IN}$ is defined as a signal that is not a balanced signal. The $+X$ and $-X$ balanced signals pass through the SDG 99 which outputs signals $Q_1$ and $Q_2$ as shown, where $Q_1 = +X + \Delta X_1$ and $Q_2 = -X + \Delta X_2$. The terms $\Delta X_1$ and $\Delta X_2$ may each comprise signal distortions proportional to $X^2$ and $X^3$. $Q_1$ and $Q_2$ are synthesized by a balun 70 such that $Q_2$ is phase shifted by $\pi$, resulting in an output signal $X_{OUT} = Q_1 - Q_2$, i.e., $$X_{OUT} = 2X + \Delta X_1 - \Delta X_2 \qquad (1)$$

The output signal $X_{OUT}$ is processed by a power amplifier 74 which generates an amplified signal $X_{AMP}$ of the form:

$$X_{AMP}=F_1(X_{OUT})+F_2(X_{OUT})^2+F_3(X_{OUT})^3 \qquad (2)$$

where $F_1$ is an amplification factor, $F_2(X_{OUT})^2$ is a second order distortion, $F_3(X_{OUT})^3$ is a third order distortion, etc. The parameters $F_1$, $F_2$, and $F_3$ are properties of the power amplifier 74 and are independent of X, but may include a dependence on the angular frequency ω. It is within the scope of the present invention for $X_{AMP}$ to also include high-order terms in $(X_{OUT})^N$ such that N>3. Such high-order terms do not appear explicitly in Equation (2) even if they are present in $X_{AMP}$, because either such high-order terms are of negligible magnitude as compared with $(X_{OUT})^2$ or $(X_{OUT})^3$, or because such high-order terms are not targeted for cancellation by the SDG 99 of the present invention in a manner to be described infra.

If $X_{OUT}$ were the undistorted signal 2X, then $X_{AMP}$ would include an unavoidable residual distortion $F_2(2X)^2+F_3(2X)^3$. The present invention, however, intentionally introduces distortion terms $\Delta X_1$ and $\Delta X_2$ into $X_{OUT}$ for the purpose of canceling the second order and third order distortion terms in Equation (2), in order to make $X_{AMP}$ distortion free. This is accomplished as follows. Let $$\Delta X_1 - \Delta X_2 = G_2 X^2 + G_3 X^3 \qquad (3)$$

where $G_2 X^2 + G_3 X^3$ is generated by the SDG 99 in combination with the balun 70. $G_2$ and $G_3$ are each assumed to be independent of X. It is within the scope of the present invention for $\Delta X_1 - \Delta X_2$ to also include linear terms (i.e., proportional to X) as well as high-order terms proportional to $X^N$ such that N>3. Such linear or high-order terms do not appear explicitly in Equation (3) even if they are present in $\Delta X_1 - \Delta X_2$, because either such linear or high-order terms are of negligible magnitude as compared with $X^2$ or $X^3$, or because such linear or high-order terms are not being utilized for cancellation of distortion terms appearing in $X_{AMP}$ in Equation (4) as will be described infra.

Substituting Equations (1) and (3) into Equation (2), and neglecting all terms of higher order than 3, yields:

$$X_{AMP}=F_1(2X)+(F_2+F_1G_2/4)(2X)^2+(F_3+F_2G_2/2+F_1G_3/8)(2X)^3 \qquad (4)$$

In order to remove the distortion terms from Equation (4), it is necessary that:

$$F_2+F_1G_2/4=0 \qquad (5)$$

and $$F_3+F_2G_2/2+F_1G_3/8=0 \qquad (6)$$

Equations (5)–(6) have the following solution for $G_2$ and $G_3$:

$$G_2=-4F_2/F_1 \qquad (7)$$

$$G_3=-8/F_1[F_3-2(F_2)^2/F_1] \qquad (8)$$

Thus, if $G_2$ and $G_3$ satisfy Equations (7) and (8), then $X_{AMP}$ will be free of second order and third order distortion. The parameters $F_1$, $F_2$, and $F_3$ are characteristic of the power amplifier 74 and are assumed to be given. Then, the SDG 99 could be configured in such a way that $G_2$ and $G_3$ satisfying Equations (7) and (8) are generated by the SDG 99 in combination with the balun 70. Since two quantities, namely $G_2$ and $G_3$, must be generated by the SDG 99 as constrained by Equations (7) and (8), it is required that the SDG 99 have at least two degrees of freedom (i.e., at least two adjustable parameters).

Figure 2:
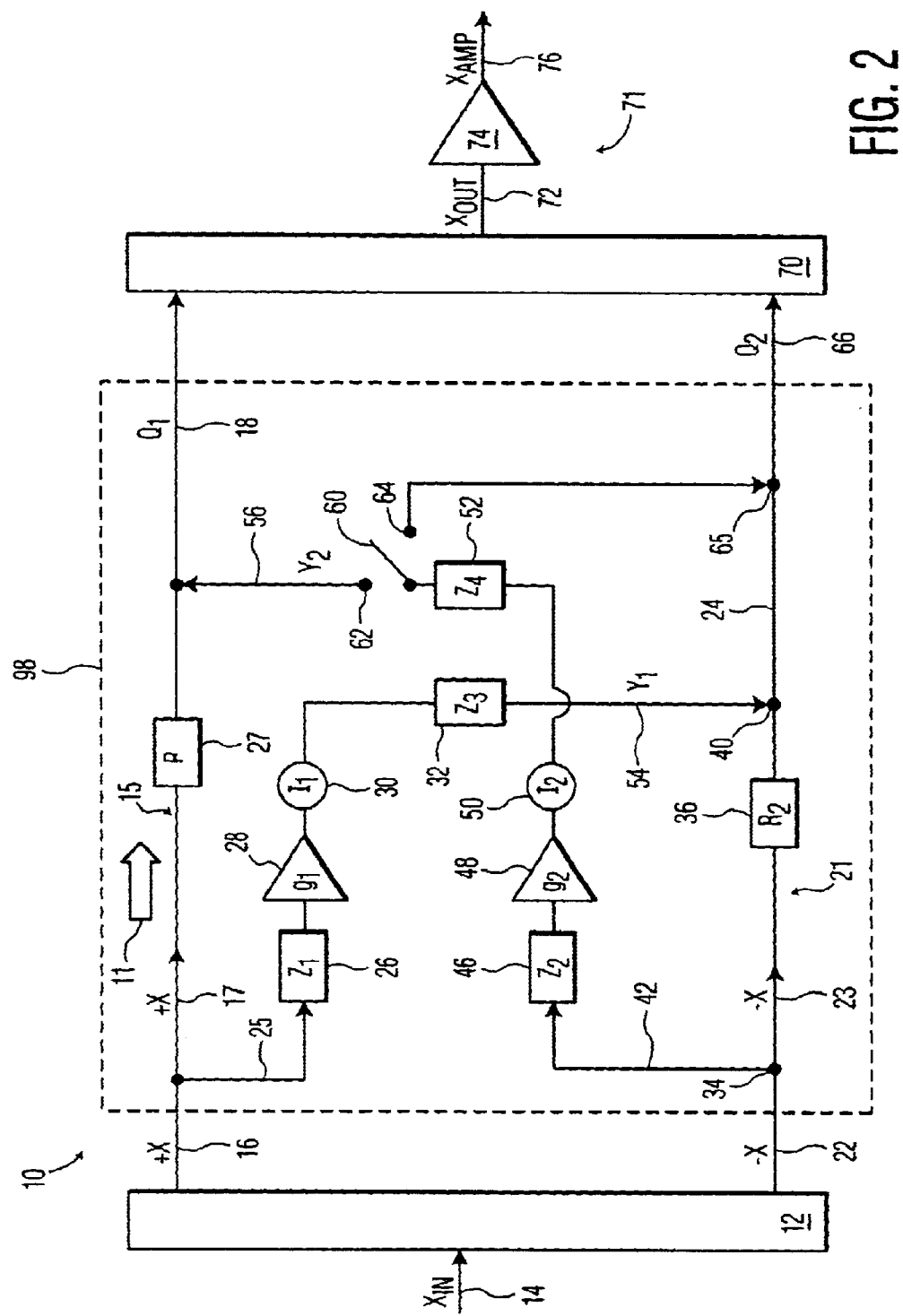
FIG. 2 depicts FIG. 1 with an embodiment of the signal distortion generator.

FIG. 2 depicts FIG. 1 with an SDG 98 exemplifying the SDG 99 of FIG. 1, in accordance with embodiments of the present invention. In FIG. 2, the balun 12 converts the unbalanced electrical signal $X_{IN}$ into balanced signals +X and −X, each having the frequency ω, on transmission line segments 16 and 22, respectively. The signal −X is equal to +X phased shifted by π radians, and $X=X_{IN}/2$, as in FIG. 1. After the signal +X passes through a transmission line 15 (comprising transmission segments 16, 17, and 18) and other circuitry beginning at circuit path 25 to be described infra, and after the signal −X passes through a transmission line 21 (comprising transmission segments 22, 23, and 24) and other circuitry beginning at circuit path 42 to be described infra, the signals +X and −X are synthesized at the balun 70 into the output signal $X_{OUT}$). The output signal $X_{OUT}$ is passed through the power amplifier 74 to generate the amplified signal $X_{AMP}$, as discussed supra in conjunction with FIG. 1.

The signal +X on transmission line segment 16 splits at node 20 into two components respectively directed into transmission line segment 17 and circuit path 25. The transmission line segment 17 is in series with a transmission line segment 18 at a node 38. An electrical resistance $R_1$ denotes the combined electrical resistance of the transmission line segments 17 and 18, and does not denote an added resistive hardware component.

The circuit path 25 is in series with an impedance element 26, an inverting amplifier 28, a nonlinear element 30, and an impedance element 32. The impedance element 26, which has an impedance $Z_1$, comprises a resistor or a filter (e.g., an RC filter). The inverting amplifier 28 has a gain $g_1$ and reverses the polarity of any electrical signal that it processes. The nonlinear element 30 comprises an ideal diode or an ideal mixer (with the diode or mixer having a bias current $I_1$) such that the nonlinear element 30 generates $2^{nd}$ and $3^{rd}$ order signal distortion and a negligible first order signal component. That is, if the nonlinear element 30 processes a signal x having an angular frequency ω, then the output signal from the nonlinear element 30 will have signal components in $x^2$ and $x^3$, respectively corresponding to signals having frequency 2ω and 3ω, and a comparatively negligible signal that is proportional to x. The impedance element 32, which has an impedance $Z_3$, comprises a resistor or a filter (e.g., an RC filter). The aforementioned circuit line starting with the circuit path 25 terminates at a circuit path 54 that feeds into a node 40. Thus a signal $Y_1$ in the circuit path 54 combines with the signal −X at the node 40 and said combined signal propagates in the direction 11 in the transmission line segment 24.

The signal −X on transmission line segment 22 splits at node 34 into two components respectively directed into transmission line segment 23 and circuit path 42. The transmission line segment 23 is in series with the transmission line segment 24 at the node 40, which is in turn in series with the transmission line segment 66 at a node 65. An electrical resistance $R_2$ denotes the combined electrical resistance of the transmission line segments 23, 24, and 66, and does not denote an added resistive hardware component.

The circuit path 42 is in series with an impedance element 46, an inverting amplifier 48, a nonlinear element 50, and an impedance element 52. The impedance element 46, which has an impedance $Z_2$, comprises a resistor or a filter (e.g., an RC filter). The inverting amplifier 48 has a gain $G_2$ and reverses the polarity of any electrical signal the it processes. The nonlinear element 50 comprises an ideal diode or an ideal mixer (with the diode or mixer having a bias current $I_2$) such that the nonlinear element 50 generates $2^{nd}$ and $3^{rd}$ order signal distortion and a negligible first order signal component. The impedance element 52, which has an impedance $Z_4$, comprises a resistor or a filter (e.g., an RC filter). The aforementioned circuit line starting with the circuit path 42 interfaces a switch element 60 at node 59. The switch element 60 may contact an electrical contact 64 of a circuit path 58 or an electrical contact 62 of a circuit path 56. If the switch element 60 contacts the electrical contact 64, then the SDG 98 is defined herein as a Type 1 Signal Distortion Generator ("Type 1 SDG") and a signal $Y_2$ in the circuit path 58 feeds into a node 65. Then the signal $Y_2$ in the circuit path 58 combines with the signal $-X$ at the node 65 and said combined signal propagates in the direction 11 in the transmission line segment 66. If the switch element 60 alternatively contacts the electrical contact 62, then the SDG 98 is defined herein as a Type 2 Signal Distortion Generator ("Type 2 SDG") and the signal $Y_2$ in the circuit path 56 feeds into the node 38. Then the signal $Y_2$ in the circuit path 56 combines with the signal $+X$ at the node 38 and said combined signal propagates in the direction 11 in the transmission line segment 18.

The following definitions apply to various circuit paths within the SDG 98. The circuit path between nodes 20 and 40 (and including the circuit path 25) is denoted herein as a first "distortion generating circuit path". The circuit path originating at node 34 and terminating at either node 65 or node 38, is denoted herein as a second "distortion generating circuit path." The circuit path originating at 34 and terminating at node 65, in conjunction with the SDG 98 being a Type 1 SDG, is denoted herein as a "second distortion generating circuit path for a Type 1 SDG." The circuit path originating at 34 and terminating at node 38, in conjunction with the SDG 98 being a Type 2 SDG, is denoted herein as a "second distortion generating circuit path for a Type 2 SDG." The term "distortion generating circuit path" may appear herein in the alternative shortened form: "distortion path" (DP).

Also definitionally, the impedance element 26 and the impedance element 32 are denoted as an "input impedance element" and an "output impedance element", respectively, of the first distortion path (or first DP). Similarly, the impedance element 46 and the impedance element 52 are denoted as an input impedance element and an output impedance element, respectively, of the second distortion path (or second DP). The ratio $|Z_1|/R_1$ is called an "input impedance ratio" of the first DP, and $|Z_3|/R_2$ is called an "output impedance ratio" of the first DP. Similarly, the ratio $|Z_2|/R_2$ is called an "input impedance ratio" of the second DP, $|Z_4|/R_2$ is called an "output impedance ratio" of the second DP for a Type 1 SDG, and $|Z_4|/R_1$ is called an "output impedance ratio" of the second DP for a Type 2 SDG.

The split of the signal $+X$ between the transmission line segment 17 and circuit path 25 at the node 20 depends on the ratio of $|Z_1|/R_1$. It is assumed herein that $|Z_1|/R_1 \geq 5$, so that only a small fraction of $+X$ branches into the circuit path 25, and almost all of $+X$ continues along the transmission line segment 17. As $|Z_1|/R_1$ increases, the small fraction deceases (e.g., $|Z_1|/R_1=15$ results in a lower small fraction than does $|Z_1|/R_1=5$). Accordingly, the signal moving in the transmission line segment 17 in the direction 11 is approximated herein as $+X$. The signal fed into the circuit path 25 is $\epsilon_1 X$, wherein $\epsilon_1$ is a positive real number satisfying $\epsilon_1 <<1$.

The split of the signal $-X$ between the transmission line segment 23 and circuit path 42 at the node 34 depends on the ratio of $|Z_2|/R_2$. It is assumed herein that $|Z_2|/R_2 \geq 5$, so that only a small fraction of $-X$ branches into the circuit path 42, and almost all of $-X$ continues along the transmission line segment 23. As $|Z_2|/R_2$ increases, the small fraction deceases (e.g., $|Z_2|/R_2=15$ results in a lower small fraction than does $|Z_2|/R_2=5$). Accordingly, the signal moving in the transmission line segment 23 in the direction 11 is approximated herein as $-X$. The signal fed into the circuit path 42 is $-\epsilon_2 X$, wherein $\epsilon_2$ is a positive real number satisfying $\epsilon_2<<1$.

The impedance $Z_3$ is assumed to satisfy $|Z_3|/R_2 \geq 5$, in order to prevent the transmission line segment 23 from being loaded by the nonlinear element 30 (i.e., to prevent current backflow from the transmission line segment 23 into the circuit path 54). The degree of protection against the transmission line segment 23 being so loaded by the nonlinear element 30 increases as $|Z_3|/R_2$ increases (e.g., $|Z_3|/R_2=15$ is more protective than is $|Z_3|/R_2=5$).

The impedance $Z_4$ is assumed to satisfy $|Z_4|/R_2 \geq 5$, in order to prevent the transmission line segment 23 from being loaded by the nonlinear element 50 when the switch element 60 contacts the electrical contact 64 with a Type 1 SDG 98. The degree of protection against the transmission line segment 23 being so loaded by the nonlinear element 50 increases as $|Z_4|/R_2$ increases (e.g., $|Z_4|/R_2=15$ is more protective than is $|Z_4|/R_2=5$).

Similarly, the impedance $Z_4$ is also assumed to satisfy $|Z_4|/R_1 \geq 5$, in order to prevent the transmission line segment 17 from being loaded by the nonlinear element 50 when the switch element 60 contacts the electrical contact 62 with a Type 2 SDG 98. The degree of protection against the transmission line segment 17 being so loaded by the nonlinear element 50 increases as $|Z_4|/R_1$ increases (e.g., $|Z_4|/R_1=15$ is more protective than is $|Z_4|/R_1=5$).

In the first distortion generating circuit path (between nodes 20 and 40), the inverting amplifier 28 amplifies the signal $\epsilon_1 X$ and reverses its polarity. Consequently, the nonlinear element 30 receives as input a signal proportional to $-X$ and generates as output second and third order distortion terms respectively proportional to $(-X)^2$ and $(-X)^3$ and a comparatively small linear term proportional to $(-X)$. Hence the signal $Y_1$ in circuit path 54 is approximately of the form $$Y_1 = A_1 X^2 - B_1 X^3 \qquad (9)$$

where $A_1$ and $B_1$ are each a function of: the impedance $Z_1$ of the impedance element 26, the gain $g_1$ of the inverting amplifier 28, the bias current $I_1$ of the nonlinear element 30 (i.e., mixer or diode), and the impedance $Z_3$ of the impedance element 32.

In the second distortion generating circuit path (beginning at nodes 34 and ending at node 65 or 38, the inverting amplifier 48 amplifies the signal $-\epsilon_2 X$ and reverses its polarity. Consequently, the nonlinear element 50 receives as input a signal proportional to $+X$ and generates as output second and third order distortion terms respectively proportional to $(+X)^2$ and $(+X)^3$ and a comparatively small linear term proportional to $+X$. Hence the signal $Y_2$ in circuit path 58 or 56 is approximately of the form $$Y_2 = A_2 X^2 + B_2 X^3 \qquad (10)$$

where $A_2$ and $B_2$ are each a function of: the impedance $Z_2$ of the impedance element 46, the gain $g_2$ of the inverting amplifier 48, the bias current $I_2$ of the nonlinear element 50 (i.e., mixer or diode), and the impedance $Z_4$ of the impedance element 52.

For a Type 1 SDG 98, the output signal $Q_1$ and $Q_2$ are $Q_1 = +X$ and $Q_2 = -X+Y_1+Y_2$. Thus using $Q_1 = +X+\Delta X_1$ and $Q_2 = -X+\Delta X_2$, as discussed supra in conjunction with FIG. 1, it follows that $\Delta X_1 = 0$ and $\Delta X_2 = Y_1+Y_2 = (A_1+A_2)X^2+(B_2-B_1)X^3$. Therefore, $$\Delta X_1 - \Delta X_2 = -(A_1+A_2)X^2 - (B_2-B_1)X^3 \qquad (11)$$

Applying Equation (11) to Equations (1), (3), and (7)–(8) leads to:

$$X_{OUT}=2X-(A_1+A_2)X^2-(B_2-B_1)X^3 \quad (12)$$

$$A_1+A_2=4F_2/F_1 \quad (13)$$

$$B_2-B_1=8/F_1(F_3-2[F_2]^2/F_1) \quad (14)$$

where $G_2=-(A_1+A_2)$ and $G_3=-(B_2-B_1)$. Thus, given parameters $F_1$, $F_2$, and $F_3$ of the power amplifier 74, second order distortion in $X_{AMP}$ is eliminated if $A_1$ and $A_2$ are chosen to satisfy Equation (13), and third order distortion in $X_{AMP}$ is eliminated if $B_1$ and $B_2$ are chosen to satisfy Equation (14). One of ordinary skill in the art could adjust $Z_1$, $g_1$, $I_1$, $Z_3$, $Z_2$, $g_2$, $I_2$, and $Z_4$, to determine values of $A_1$, $A_2$, $B_1$, and $B_2$ that satisfy Equations (13) and (14).

The Type 1 SDG 98 is said to have "DP symmetry" if the first distortion path (between nodes 20 and 40) is electrically equal to the second distortion path (between nodes 34 and 65) (i.e., if $Z_1=Z_2$, $g_1=g_2$, $I_1=I_2$, and $Z_3=Z_4$). If the Type 1 SDG 98 has "DP symmetry," then $A_1=A_2=A$ and $B_1=B_2=B_1$ and from Equations (12) and (13):

$$X_{OUT}=2X-2AX^2 \quad (15)$$

and $$A=2F_2/F_1 \quad (16)$$

However, Equation (14) cannot be satisfied since $B_2-B_1=0$. Thus the aforementioned assumption of symmetry for the Type 1 SDG 98 does not permit elimination of third order distortion in $X_{AMP}$, but nonetheless eliminates second order distortion in $X_{AMP}$ since one of ordinary skill in the art can choose values of $Z_1$, $g_1$, $I_1$ $Z_3$ such that A is determined to satisfy Equation (16).

For a Type 2 SDG 98, the output signal $Q_1$ and $Q_2$ are $Q_{1=+X+Y2}$ and $Q_2=-X+Y_1$. Thus using $Q_1=+X+\Delta X_1$ and $Q_2=-X+\Delta X_2$, as discussed supra in conjunction with FIG. 1, it follows that $\Delta X_1=Y_2=A_2X^2+B_2X^3$, and $\Delta X_2=Y_1=A_1X^2-B_1X^3$. Therefore, $$\Delta X_1-\Delta X_2=(A_2-A_1)X^2+(B_2+B_1)X^3 \quad (17)$$

Applying Equation (17) to Equations (1), (3), and (7)–(8) leads to:

$$X_{OUT}=2X+(A_2-A_1)X^2+(B_2+B_1)X^3 \quad (18)$$

$$A_1-A_2=4F_2/F_1 \quad (19)$$

$$B_2+B_1=-8/F_1[F_3-2(F_2)^2/F_1] \quad (20)$$

where $G_2=A_2-A_1$ and $G_3=B_2+B_1$. Thus, given parameters $F_1$, $F_2$, and $F_3$ of the power amplifier 74, second order distortion in $X_{AMP}$ is eliminated if $A_1$ and $A_2$ are chosen to satisfy Equation (19), and third order distortion in $X_{AMP}$ is eliminated if $B_1$ and $B_2$ are chosen to satisfy Equation (20). One of ordinary skill in the art could adjust $Z_1$, $g_1$, $I_1$, $Z_3$, $Z_2$, $g_2$, $I_2$, and $Z_4$, to determine values of $A_1$, $A_2$, $B_1$, and $B_2$ that satisfy Equations (19) and (20).

The Type 2 SDG 98 is said to have "DP symmetry" if the first distortion path (between nodes 20 and 40) is electrically equal to the second distortion path (between nodes 34 and 38) (i.e., if $Z_1=Z_2$, $g_1=g_2$, $I_1=I_2$, and $Z_3=Z_4$). If the Type 2 SDG 98 has "DP symmetry," then $A_1=A_2=A$ and $B_1=B_2=B$, and from Equations (18) and (20):

$$X_{OUT}=2X+2BX^2 \quad (21)$$

and $$B=-4/F_1[F_3-2(F_2)^2/F_1] \quad (22)$$

However, Equation (19) cannot be satisfied since $A_2-A_1=0$. Thus the aforementioned assumption of symmetry for the Type 2 SDG 98 does not permit elimination of second order distortion in $X_{AMP}$, but nonetheless eliminates third order distortion in $X_{AMP}$ since one of ordinary skill in the art can choose values of $Z_1$, $g_1$, $B_1$, $Z_3$ such that B is determined to satisfy Equation (22).

While the SDGs 99 and 98 of FIGS. 1 and 2, respectively, have been applied to distortion of balanced signals of a single frequency $\omega$, the SDGs 99 and 98 may be used to generate distortion for multiple frequency balanced signals (i.e., either for discrete frequencies or for a continuum of frequencies). For multiple frequency applications, the present invention can be used to eliminate second and/or third order distortion in $X_{AMP}$ for the worst-case frequency (i.e., the frequency ascertained to be the most limiting frequency in the design application). Note that second and/or third order distortion in $X_{AMP}$ can be totally eliminated for more than one relevant frequency (i.e., a frequency for which distortion is to be eliminated or reduced) to the extent that a sufficient number of degrees of freedom (i.e., number of electrical parameters that may be adjusted) of the SDGs 99 aor 98 are available. If the number of such relevant frequencies is such that an insufficient number of such degrees of freedom are available, then the present invention may be used to reduce, but not eliminate, distortion for said relevant frequencies to an extent that the resulting reduced distortion in said relevant frequencies are within acceptable design limits. The reduced distortion in said relevant frequencies may be achieved by choosing design values of $Z_1$, $g_1$, $I_1$ $Z_3$, $Z_2$, $g_2$, $I_2$, and $Z_4$ such that the coefficients of $(2X)^2$ and $(2X)^3$ in Equation (4) have acceptably bounded values for the relevant frequencies under consideration.

Figure 3:
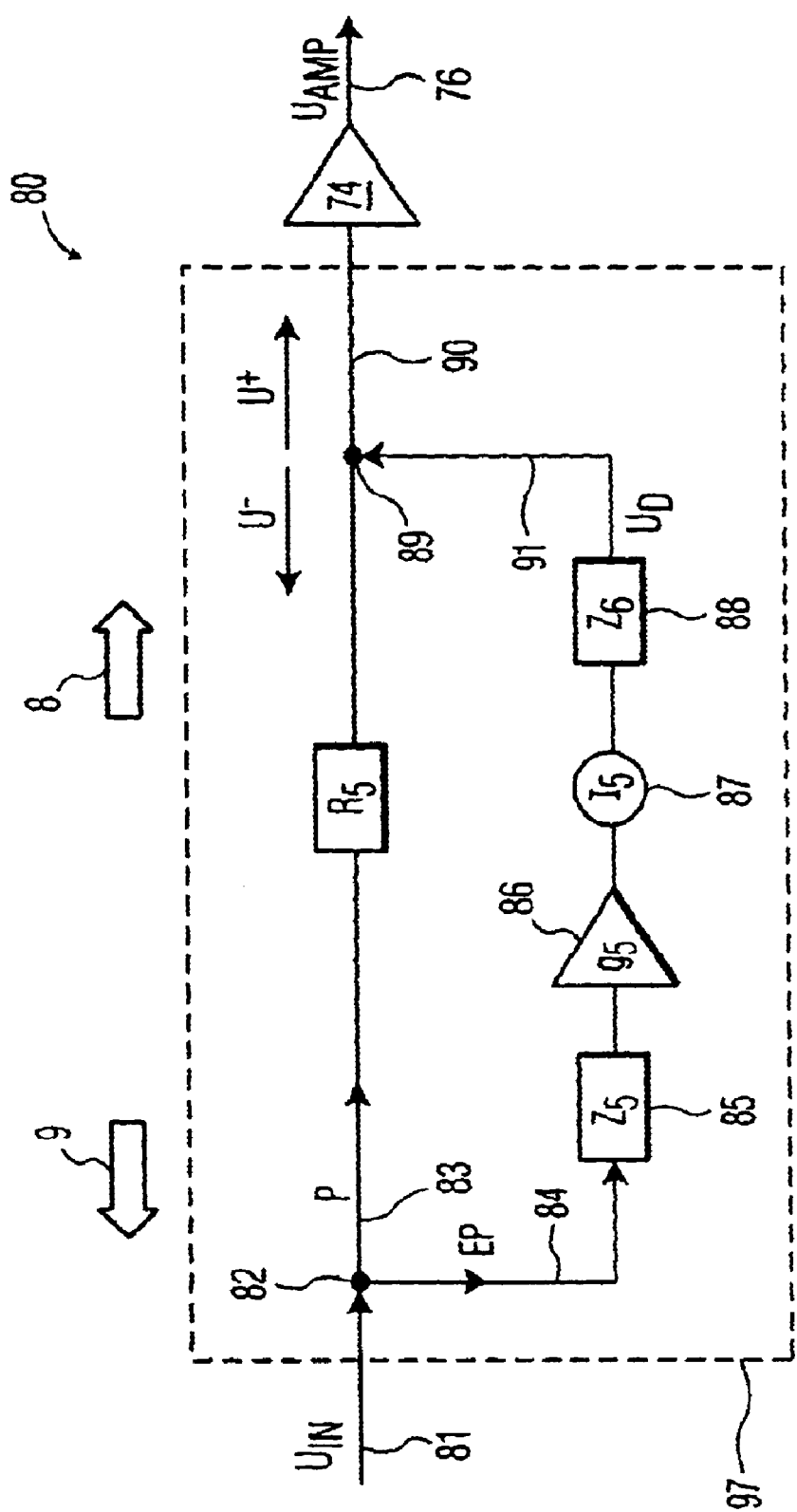
FIG. 3 depicts an electrical structure that includes a signal distortion generator for an unbalanced signal, in accordance with embodiments of the present invention.

FIG. 3 depicts an electrical structure 80 that includes a signal distortion generator 97 for generating distortion in an unbalanced signal $U_{IN}$ on input line 81, in accordance with embodiments of the present invention. The unbalanced signal $U_{IN}$ is a periodic electrical signal having an angular frequency $\omega$. $U_{IN}$ enters a node 82 at which $U_{IN}$ splits into signal P in transmission line segment 83 and signal $\epsilon P$ in circuit path 84 of a signal distortion generator (SDG) 97, wherein P is approximately equal to $U_{IN}$ and wherein $\epsilon$ is a positive real number such that $\epsilon<<1$. The transmission line segment 83 has a transmission line resistance $R_5$. The SDG 97 includes a series arrangement of an impedance element 85, an amplifier structure 86, and a nonlinear element 87, and an impedance element 88. The impedance element 85, which has an impedance $Z_5$, comprises a resistor or a filter (e.g., an RC filter). The amplifier structure 86 has a gain $g_5$ and comprises one or more amplifiers as needed to have the gain $G_5$. The nonlinear element 87 comprises an non-ideal diode or an non-ideal mixer, either of which generates a first order signal component and $2^{nd}$ and $3^{rd}$ order signal distortion that depends on the bias current $I_5$ of the nonlinear element 87. The impedance element 88, which has an impedance $Z_6$, comprises a resistor or a filter (e.g., an RC filter). It is assumed that $|Z_5|/R_5 \geq 5$ and $|Z_6|/R_5 \geq 5$, so that the signal $\epsilon P$ in circuit path 84 is small compared with P (i.e., $\epsilon<<1$ as stated supra). Since the nonlinear element 87 is non-ideal, the output signal $U_D$ in circuit path segment 91 comprises a linear signal term as well as second and third order distortion terms, and is of the form:

$$U_D=\alpha P+\beta P^2+\gamma P^3 \quad (23)$$

where $\alpha$, $\beta$, and $\gamma$ each are a function of $Z_5$, $g_5$, $I_5$, and $Z_6$. $U_D$ enters the node 89 and splits into components $U^+$ and $U^-$, wherein $U^+=U_D/2$ and is in the direction 8, wherein $U^-=U_D/2$ and is in the direction 9 that is opposite to the direction 8. Hence, the total signal current $U_{OUT}$ entering a power amplifier 74 from the transmission line segment 90 is a sum of P and $U^+$; i.e., $$U_{OUT}=P+(\alpha P+\beta P^2+\gamma P^3)/2 \tag{24}$$

Noting from the discussion supra of Equation (2), the power amplifier 74 is characterized by frequency-dependent parameters $F_1$, $F_2$, and $F_3$ as follows:

$$U_{AMP}=F_1(U_{OUT})+F_2(U_{OUT})^2+F_3(U_{OUT})^3 \tag{25}$$

where $U_{AMP}$ is the amplified signal output in node 76 from the power amplifier 74. Thus, if $U_{OUT}$ of Equation (24) is plugged into Equation (25), and if the resulting multiplicative terms on $P^2$ and $P^3$ in $U_{AMP}$ are set equal to zero, then the following equations result:

$$F_1\beta/2+F_2(1+\alpha/2)^2=0 \tag{26}$$

$$F_1\gamma/2+F_2(1+\alpha/2)\beta+F_3(1+\alpha/2)^3=0 \tag{27}$$

Equations (26) and (27) may be solved for $\beta$ and $\gamma$ as follows:

$$\beta=-(F_2/F_1)(1+\alpha/2)^2 \tag{28}$$

$$\gamma=-(2/F_1)[(-(F_2)^2/F_1+F_3)(1+\alpha/2)^3] \tag{29}$$

in terms of $F_1$, $F_2$, and $F_3$, and $\alpha$. Since $F_1$, $F_2$, and $F_3$ are characteristic of the power amplifier 74, and since $\alpha$, $\beta$, and $\gamma$ each are each a known function of $Z_5$, $G_5$, $I_5$, and $Z_6$ as characteristic of the SDG 97, it follows that one skilled in the art could determine values of $Z_5$, $g_5$, $I_5$, and $Z_6$ (and thus $\beta$ and $\gamma$) such that Equations (26) and (27) are satisfied, so that the second and third order distortions in $U_{AMP}$ would consequently vanish.

For multiple frequency applications, the SDG 97 may be used to eliminate or reduce distortion in one or more relevant frequencies in the same manner as the SDG 99 or SDG 98 may be used to eliminate or reduce distortion in one or more relevant frequencies, as was discussed supra.

The SDG 97 of FIG. 3 is defined herein as a Type 3 Signal Distortion Generator ("Type 3 SDG").

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

We claim:

1. An electrical structure, comprising a signal distortion generator that is configured to receive a pair of balanced input currents $+X$ and $-X$ each having a same angular frequency $\omega$, and to generate a pair of output currents $+X+\Delta X_1$ and $-X+\Delta X_2$, wherein $\Delta X_1$ $\Delta X_2$ comprise signal distortions generated by the signal distortion generator, wherein $\Delta X_1-\Delta X_2=G_2X^2+G_3X^3$, wherein X is the magnitude of each of the input currents $+X$ and $-X$, wherein $G_2$ and $G_3$ are coefficients of signal distortions terms proportional to $X^2$ and $X^3$, respectively, in $\Delta X_1-\Delta X_2$, wherein $G_2$ and $G_3$ are each independent of X, and wherein at least one of $G_2$ and $G_3$ is nonzero.

2. The electrical structure of claim 1, wherein $G_2 \neq 0$ and $G_3 \neq 0$.

3. The electrical structure of claim 1, wherein $G_2 \neq 0$ and $G_3 = 0$.

4. The electrical structure of claim 1, wherein $G_2 = 0$ and $G_3 \neq 0$.

5. The electrical structure of claim 1, further comprising a balun coupled to the signal distortion generator, wherein the balun is configured to synthesize the pair of output currents to form an unbalanced output current $X_{OUT}$, and wherein $X_{OUT}=2X+\Delta X_1-\Delta X_2$.

6. The electrical structure of claim 5, further comprising a power amplifier coupled to the balun, wherein the power amplifier is configured to receive as input $X_{OUT}$ and to internally generate an amplified signal $X_{AMP}$, wherein $X_{AMP}=F_1(X_{OUT})+F_2(X_{OUT})^2+F_3(X_{OUT})^3$, wherein $F_1$, $F_2$, and $F_3$ are coefficients of distortion terms proportional to $(X_{OUT})$, $(X_{OUT})^2$ and $(X_{OUT})^3$, respectively, in $X_{AMP}$, wherein $F_1$, $F_2$, and $F_3$ are each independent of X, and wherein $G_2$ and $G_3$ have values resulting in $X_{AMP}$ being independent of both $X^2$ and $X^3$.

7. An electrical structure, comprising a signal distortion generator (SDG) that is configured to receive a pair of balanced input currents $+X$ and $-X$ each having a same angular frequency $\omega$, and to generate a pair of output currents $+X+\Delta X_1$ and $-X+\Delta X_2$, wherein $\Delta X_1$ and $\Delta X_2$ comprise signal distortions generated by the signal distortion generator, wherein $\Delta X_1-\Delta X_2=G_2X^2+G_3X^3$, wherein X is the magnitude of each of the input currents $+X$ and $-X$, wherein $G_2$ and $G_3$ are coefficients of signal distortions terms proportional to $X^2$ and $X^3$, respectively, in $\Delta X_1-\Delta X_2$, wherein $G_2$ and $G_3$ are each independent of X, wherein at least one of $G_2$ and $G_3$ is nonzero, and wherein the SDG is selected from the group consisting of a Type 1 SDG and a Type 2 SDG.

8. The electrical structure of claim 7, wherein $G_2 \neq 0$ and $G_3 \neq 0$.

9. The electrical structure of claim 7, wherein the SDG includes a first distortion path (DP) and a second DP, wherein the first DP has an input impedance ratio of at least 5 and an output impedance ratio of at least 5, and wherein the second DP has an input impedance ratio of at least 5 and an output impedance ratio of at least 5.

10. The electrical structure of claim 9, wherein the first DP includes a first input impedance element selected from the group consisting of a resistor and a filter, wherein the first DP includes a first output impedance element selected from the group consisting of a resistor and a filter, wherein the second DP includes a first input impedance element selected from the group consisting of a resistor and a filter, and wherein the second DP includes a second output impedance element selected from the group consisting of a resistor and a filter.

11. The electrical structure of claim 9, wherein the first DP includes a first nonlinear element selected from the group consisting of a diode and a mixer, and wherein the second DP includes a second nonlinear element selected from the group consisting of a diode and a mixer.

12. The electrical structure of claim 9, wherein the SDG is a Type 1 SDG.

13. The electrical structure of claim 12, wherein $G_2 \neq 0$ and $G_3 = 0$.

14. The electrical structure of claim 13, wherein the SDG includes DP symmetry.

15. The electrical structure of claim 9, wherein the SDG is a Type 2 SDG.

16. The electrical structure of claim 15, wherein $G_2 = 0$ and $G_3 \neq 0$.

17. The electrical structure of claim 16, wherein the SDG includes DP symmetry.

18. The electrical structure of claim 9, further comprising a balun coupled to the SDG, wherein the balun is configured to synthesize the pair of output currents to form an unbalanced output current $X_{OUT}$, and wherein $X_{OUT}=2X+\Delta X_1-\Delta X_2$.

19. The electrical structure of claim 18, further comprising a power amplifier coupled to the balun, wherein the power amplifier is configured to receive as input $X_{OUT}$ and to internally generate an amplified signal $X_{AMP}$, wherein $X_{AMP}=F_1(X_{OUT})+F_2(X_{OUT})^2+F_3(X_{OUT})^3$, wherein $F_1$, $F_2$, and $F_3$ are coefficients of distortion terms proportional to $(X_{OUT})$, $(X_{OUT})^2$ and $(X_{OUT})^3$, respectively, in $X_{AMP}$, wherein $F_1$, $F_2$, and $F_3$ are each independent of X, and wherein $G_2$ and $G_3$ have values resulting in $X_{AMP}$ being independent of both $X^2$ and $X^3$.

20. The electrical structure of claim 18, further comprising a power amplifier coupled to the balun, wherein the power amplifier is configured to receive as input $X_{OUT}$ and to internally generate an amplified signal $X_{AMP}$, wherein $X_{AMP}=F_1(X_{OUT})+F_2(X_{OUT})^2+F_3(X_{OUT})^3$, wherein $F_1$, $F_2$, and $F_3$ are coefficients of distortion terms proportional to $(X_{OUT})$, $(X_{OUT})^2$ and $(X_{OUT})^3$, respectively, in $X_{AMP}$, wherein $F_1$, $F_2$, and $F_3$ are each independent of X, and wherein $G_2$ and $G_3$ have values resulting in $X_{AMP}$ being independent of one of $X_2$ and $X_3$ and dependent on a remaining other of $X_2$ and $X_3$.

21. A method for forming an electrical structure, comprising providing a signal distortion generator that is configured to receive a pair of balanced input currents +X and −X each having a same angular frequency ω, and to generate a pair of output currents $+X+\Delta X_1$ and $-X+\Delta X_2$, wherein $\Delta X_1$ and $\Delta X_2$ comprise signal distortions generated by the signal distortion generator, wherein $\Delta X_1-\Delta X_2=G_2X^2+G_3X^3$, wherein X is the magnitude of each of the input currents +X and −X, wherein $G_2$ and $G_3$ are coefficients of signal distortions terms proportional to $X^2$ and $X^3$, respectively, in $\Delta X_1-\Delta X_2$, wherein $G_2$ and $G_3$ are each independent of X, and wherein at least one of $G_2$ and $G_3$ is nonzero.

22. The method claim 21, wherein $G_2 \neq 0$ and $G_3 \neq 0$.

23. The method claim 21, wherein $G_2 \neq 0$ and $G_3 = 0$.

24. The method of claim 21, wherein $G_2 = 0$ and $G_3 \neq 0$.

25. The method of claim 21, further comprising coupling a balun to the signal distortion generator, wherein the balun is configured to synthesize the pair of output currents to form an unbalanced output current $X_{OUT}$, and wherein $X_{OUT}=2X+\Delta X_1-\Delta X_2$.

26. The method of claim 25, further comprising coupling a power amplifier to the balun, wherein the power amplifier is configured to receive as input $X_{OUT}$ and to internally generate an amplified signal $X_{AMP}$, wherein $X_{AMP}=F_1(X_{OUT})+F_2(X_{OUT})^2+F_3(X_{OUT})^3$, wherein $F_1$, $F_2$, and $F_3$ are coefficients of distortion terms proportional to $(X_{OUT})$, $(X_{OUT})^2$ and $(X_{OUT})^3$, respectively, in $X_{AMP}$, wherein $F_1$, $F_2$, and $F_3$ are each independent of X, and wherein $G_2$ and $G_3$ have values resulting in $X_{AMP}$ being independent of both $X_2$ and $X_3$.

27. A method for forming an electrical structure, comprising providing a signal distortion generator (SDG) that is configured to receive a pair of balanced input currents +X and −X each having a same angular frequency ω, and to generate a pair of output currents $+X+\Delta X_1$ and $-X+\Delta X_2$, wherein $\Delta X_1$ and $\Delta X_2$ comprise signal distortions generated by the signal distortion generator, wherein $\Delta X_1-\Delta X_2=G_2X^2+G_3X^3$, wherein X is the magnitude of each of the input currents +X and −X, wherein $G_2$ and $G_3$ are coefficients of signal distortions terms proportional to $X^2$ and $X^3$, respectively, in $\Delta X_1-\Delta X_2$, wherein $G_2$ and $G_3$ are each independent of X, wherein at least one of $G_2$ and $G_3$ is nonzero, and wherein the SDG is selected from the group consisting of a Type 1 SDG and a Type 2 SDG.

28. The method claim 27, wherein $G_2 \neq 0$ and $G_3 \neq 0$.

29. The method of claim 27, wherein the SDG includes a first distortion path (DP) and a second DP, wherein the first DP has an input impedance ratio of at least 5 and an output impedance ratio of at least 5, and wherein the second DP has an input impedance ratio of at least 5 and an output impedance ratio of at least 5.

30. The method of claim 29, wherein the first DP includes a first input impedance element selected from the group consisting of a resistor and a filter, wherein the first DP includes a first output impedance element selected from the group consisting of a resistor and a filter, wherein the second DP includes a second input impedance element selected from the group consisting of a resistor and a filter, and wherein the second DP includes a second output impedance element selected from the group consisting of a resistor and a filter.

31. The method of claim 29, wherein the first DP includes a first nonlinear element selected from the group consisting of a diode and a mixer, and wherein the second DP includes a second nonlinear element selected from the group consisting of a diode and a mixer.

32. The method of claim 29, wherein the SDG is a Type 1 SDG.

33. The method of claim 32, wherein $G_2 \neq 0$ and $G_3 = 0$.

34. The method of claim 33, wherein the SDG includes DP symmetry.

35. The method of claim 29, wherein the SDG is a Type 2 SDG.

36. The method of claim 35, wherein $G_2 = 0$ and $G_3 \neq 0$.

37. The method of claim 36, wherein the SDG includes DP symmetry.

38. The method of claim 29, further comprising coupling a balun to the signal distortion generator, wherein the balun is configured to synthesize the pair of output currents to form an unbalanced output current $X_{OUT}$, and wherein $X_{OUT}=2X+\Delta X_1-\Delta X_2$.

39. The method of claim 38, further comprising coupling a power amplifier to the balun, wherein the power amplifier is configured to receive as input $X_{OUT}$ and to internally generate an amplified signal $X_{AMP}$, wherein $X_{AMP}=F_1(X_{OUT})+F_2(X_{OUT})^2+F_3(X_{OUT})^3$, wherein $F_1$, $F_2$, and $F_3$ are coefficients of distortion terms proportional to $(X_{OUT})$, $(X_{OUT})^2$ and $(X_{OUT})^3$, respectively, in $X_{AMP}$, wherein $F_1$, $F_2$, and $F_3$ are each independent of X, and wherein $G_2$ and $G_3$ have values resulting in $X_{AMP}$ being independent of both $X^2$ and $X^3$.

40. The method of claim 38, further comprising coupling a power amplifier to the balun, wherein the power amplifier is configured to receive as input $X_{OUT}$ and to internally generate an amplified signal $X_{AMP}$, wherein $X_{AMP}=F_1(X_{OUT})+F_2(X_{OUT})^2+F_3(X_{OUT})^3$, wherein $F_1$, $F_2$, and $F_3$ are coefficients of distortion terms proportional to $(X_{OUT})$, $(X_{OUT})^2$ and $(X_{OUT})^3$, respectively, in $X_{AMP}$, wherein $F_1$, $F_2$, and $F_3$ are each independent of X, and wherein $G_2$ and $G_3$ have values resulting in $X_{AMP}$ being independent of one of $X^2$ and $X^3$ and dependent on a remaining other of $X^2$ and $X^3$.

41. A method for generating signal distortion, comprising:
providing a signal distortion generator (SDG) that is configured to receive a pair of balanced input currents +X and −X each having a same angular frequency ω, and to generate a pair of output currents $+X+\Delta X_1$ and $-X+\Delta X_2$, wherein $\Delta X_1$ and $\Delta X_2$ comprise signal distortions generated by the signal distortion generator, wherein $\Delta X_1-\Delta X_2=G_2X^2+G_3X^3$, wherein X is the magnitude of each of the input currents +X and −X, wherein $G_2$ and $G_3$ are coefficients of signal distortions terms proportional to $X^2$ and $X^3$, respectively, in $\Delta X_1-$ $\Delta X_2$, wherein $G_2$ and $G_3$ are each independent of X, and wherein at least one of $G_2$ and $G_3$ is nonzero;

providing the pair of balanced input currents;

receiving by the SDG the pair of balanced input currents; and generating by the SDG the pair of output currents.

42. The method of claim 41, wherein $G_2 \neq 0$ and $G_3 \neq 0$.

43. The method claim 41, wherein $G_2 \neq 0$ and $G_3 = 0$.

44. The method of claim 41, wherein $G_2 = 0$ and $G_3 \neq 0$.

45. The method of claim 41, further comprising:

prior to the receiving, coupling a balun to the signal distortion generator, wherein the balun is configured to synthesize the pair of output currents to form an unbalanced output current $X_{OUT}$, and wherein $X_{OUT} = 2X + \Delta X_1 - \Delta X_2$; and synthesizing by the balun the pair of output currents.

46. The method of claim 45, further comprising:

prior to the receiving, coupling a power amplifier to the balun, wherein the power amplifier is configured to receive as input $X_{OUT}$ and to internally generate an amplified signal $X_{AMP}$, wherein $X_{AMP} = F_1(X_{OUT}) + F_2(X_{OUT})^2 + F_3(X_{OUT})^3$, wherein $F_1$, $F_2$, and $F_3$ are coefficients of distortion terms proportional to $(X_{OUT})$, $(X_{OUT})^2$ and $(X_{OUT})^3$, respectively, in $X_{AMP}$, wherein $F_1$, $F_2$, and $F_3$ are each independent of X, and wherein $G_2$ and $G_3$ have values resulting in $X_{AMP}$ being independent of both $X^2$ and $X^3$;

receiving $X_{OUT}$ by the power amplifier; and generating $X_{AMP}$ by the power amplifier.

47. A method for generating signal distortion, comprising:

providing a signal distortion generator (SDG) that is configured to receive a pair of balanced input currents +X and −X each having a same angular frequency ω, and to generate a pair of output currents $+X + \Delta X_1$ and $-X + \Delta X_2$, wherein $\Delta X_1$ and $\Delta X_2$ comprise signal distortions generated by the signal distortion generator, wherein $\Delta X_1 - \Delta X_2 = G_2 X^2 + G_3 X^3$, wherein X is the magnitude of each of the input currents +X and −X, wherein $G_2$ and $G_3$ are coefficients of signal distortions terms proportional to $X^2$ and $X^3$, respectively, in $\Delta X_1 - \Delta X_2$, wherein $G_2$ and $G_3$ are each independent of X, wherein at least one of $G_2$ and $G_3$ is nonzero, and wherein the SDG is selected from the group consisting of a Type 1 SDG and a Type 2 SDG;

providing the pair of balanced input currents;

receiving by the SDG the pair of balanced input currents; and generating by the SDG the pair of output currents.

48. The method of claim 47, wherein $G_2 \neq 0$ and $G_3 \neq 0$.

49. The method of claim 47, wherein the SDG includes a first distortion path (DP) and a second DP, wherein the first DP has an input impedance ratio of at least 5 and an output impedance ratio of at least 5, and wherein the second DP has an input impedance ratio of at least 5 and an output impedance ratio of at least 5.

50. The method of claim 49, wherein the first DP includes a first input impedance element selected from the group consisting of a resistor and a filter, wherein the first DP includes a first output impedance element selected from the group consisting of a resistor and a filter, wherein the second DP includes a second input impedance element selected from the group consisting of a resistor and a filter, and wherein the second DP includes a second output impedance element selected from the group consisting of a resistor and a filter.

51. The method of claim 49, wherein the first DP includes a first nonlinear element selected from the group consisting of a diode and a mixer, and wherein the second DP includes a second nonlinear element selected from the group consisting of a diode and a mixer.

52. The method of claim 49, wherein the SDG is a Type 1 SDG.

53. The method of claim 52, wherein $G_2 \neq 0$ and $G_3 = 0$.

54. The method of claim 53, wherein the SDG includes DP symmetry.

55. The method of claim 49, wherein the SDG is a Type 2 SDG.

56. The method of claim 55, wherein $G_2 = 0$ and $G_3 \neq 0$.

57. The method of claim 56, wherein the SDG includes DP symmetry.

58. The method of claim 49, further comprising:

coupling a balun to the signal distortion generator, wherein the balun is configured to synthesize the pair of output currents to form an unbalanced output current $X_{OUT}$, and wherein $X_{OUT} = 2X + \Delta X_1 - \Delta X_2$; and synthesizing by the balun the pair of output currents.

59. The method of claim 58, further comprising:

coupling a power amplifier to the balun, wherein the power amplifier is configured to receive as input $X_{OUT}$ and to internally generate an amplified signal $X_{AMP}$, wherein $X_{AMP} = F_1(X_{OUT}) + F_2(X_{OUT})^2 + F_3(X_{OUT})^3$, wherein $F_1$, $F_2$, and $F_3$ are coefficients of distortion terms proportional to $(X_{OUT})$, $(X_{OUT})^2$ and $(X_{OUT})^3$, respectively, in $X_{AMP}$, wherein $F_1$, $F_2$, and $F_3$ are each independent of X, and wherein $G_2$ and $G_3$ have values resulting in $X_{AMP}$ being independent of both $X^2$ and $X^3$;

receiving $X_{OUT}$ by the power amplifier; and generating $X_{AMP}$ by the power amplifier.

60. The method of claim 58, further comprising:

coupling a power amplifier to the balun, wherein the power amplifier is configured to receive as input $X_{OUT}$ and to internally generate an amplified signal $X_{AMP}$, wherein $X_{AMP} = F_1(X_{OUT}) + F_2(X_{OUT})^2 + F_3(X_{OUT})^3$, wherein $F_1$, $F_2$, and $F_3$ are coefficients of distortion terms proportional to $(X_{OUT})$, $(X_{OUT})_2$ and $(X_{OUT})^3$, respectively, in $X_{AMP}$, wherein $F_1$, $F_2$, and $F_3$ are each independent of X, and wherein $G_2$ and $G_3$ have values resulting in $X_{AMP}$ being independent of one of $X_2$ and $X_3$ and dependent on a remaining other of $X_2$ and $X^3$;

receiving $X_{OUT}$ by the power amplifier; and generating $X_{AMP}$ by the power amplifier.

* * * * *